(12) United States Patent
Kelly

(10) Patent No.: US 11,038,473 B2
(45) Date of Patent: Jun. 15, 2021

(54) PHASE SHIFTERS FOR GALLIUM NITRIDE AMPLIFIERS AND RELATED METHODS

(71) Applicant: MACOM Technology Solutions Holdings, Inc., Lowell, MA (US)

(72) Inventor: Thomas Kelly, Lowell, MA (US)

(73) Assignee: MACOM TECHNOLOGY SOLUTIONS HOLDINGS, INC., Lowell, MA (US)

( * ) Notice: Subject to any disclaimer, the term of this patent is extended or adjusted under 35 U.S.C. 154(b) by 0 days.

(21) Appl. No.: 16/439,422

(22) Filed: Jun. 12, 2019

(65) Prior Publication Data

US 2020/0067465 A1 Feb. 27, 2020

Related U.S. Application Data

(63) Continuation of application No. 15/293,515, filed on Oct. 14, 2016, now abandoned.

(51) Int. Cl.
*H03F 1/30* (2006.01)
*H03H 7/20* (2006.01)
(Continued)

(52) U.S. Cl.
CPC ......... *H03F 1/306* (2013.01); *H01L 29/2003* (2013.01); *H01P 1/184* (2013.01); *H01P 1/185* (2013.01); *H03F 1/30* (2013.01); *H03F 1/52* (2013.01); *H03F 1/56* (2013.01); *H03F 3/19* (2013.01); *H03F 3/195* (2013.01); *H03H 7/20* (2013.01); *H01L 29/7787* (2013.01);
(Continued)

(58) Field of Classification Search
CPC ...................................................... H03F 1/306
See application file for complete search history.

(56) References Cited

U.S. PATENT DOCUMENTS 3,906,310 A 9/1975 Esashika
4,078,247 A 7/1978 Albrecht
(Continued)

FOREIGN PATENT DOCUMENTS

CN 1106572 A 8/1995
CN 105518865 A 4/2016
(Continued)

OTHER PUBLICATIONS

International Search Report and Written Opinion for International Application No. PCT/US2016/046159, dated Nov. 17, 2016.
(Continued)

*Primary Examiner* — Patricia T Nguyen
(74) *Attorney, Agent, or Firm* — Thomas | Horstemeyer, LLP.; Jason M. Perilla

(57) ABSTRACT

Circuits for protecting devices, such as gallium nitride (GaN) devices, and operating methods thereof are described. Such circuits may include a temperature sensor configured to sense the temperature of at least a portion of a device, and a phase shifter configured to shift the phase of the signal output by the device, when the sensed temperature is outside a safe temperature range, e.g., above a predefined temperature threshold. The phase may be shifted discretely or continuously. These circuits safeguard devices from damaging operating conditions to prolong the operating life of the protected devices.

20 Claims, 7 Drawing Sheets

(51) Int. Cl.
    *H03F 1/56*     (2006.01)
    *H03F 3/19*     (2006.01)
    *H03F 1/52*     (2006.01)
    *H01L 29/20*     (2006.01)
    *H01P 1/18*     (2006.01)
    *H01P 1/185*     (2006.01)
    *H03F 3/195*     (2006.01)
    *H01L 29/778*     (2006.01)
    *H01L 29/808*     (2006.01)

(52) U.S. Cl.
    CPC ...... *H01L 29/808* (2013.01); *H03F 2200/447* (2013.01); *H03F 2200/451* (2013.01); *H03F 2200/468* (2013.01)

(56) References Cited

U.S. PATENT DOCUMENTS

| | | |
|---|---|---|
| 4,127,885 A | 11/1978 | Adam et al. |
| 4,442,416 A | 10/1984 | Epsom et al. |
| 5,061,863 A | 10/1991 | Mori et al. |
| 5,389,813 A | 2/1995 | Schwob |
| 5,510,753 A | 4/1996 | French |
| 5,574,610 A | 11/1996 | Tachick et al. |
| 5,712,592 A | 1/1998 | Stimson et al. |
| 5,986,500 A | 11/1999 | Park et al. |
| 5,994,965 A | 11/1999 | Davis et al. |
| 6,552,620 B2 | 4/2003 | Gitsevich et al. |
| 6,560,081 B1 | 5/2003 | Vashchenko et al. |
| 6,650,173 B1 | 11/2003 | Khouri et al. |
| 6,778,018 B2 | 8/2004 | Joly et al. |
| 6,784,837 B2 | 8/2004 | Revankar et al. |
| 6,774,718 B2 | 10/2004 | Ichitsubo et al. |
| 6,950,636 B2 | 9/2005 | Rozenblit et al. |
| 7,031,127 B1 | 4/2006 | D'Aquino et al. |
| 7,271,658 B2 | 9/2007 | Matsushita et al. |
| 7,268,621 B2 | 11/2007 | Kanoh et al. |
| 7,352,237 B2 | 1/2008 | Snelgrove et al. |
| 7,328,041 B2 | 5/2008 | Tasaka |
| 7,471,493 B1 | 12/2008 | Huang et al. |
| 7,586,720 B1 | 8/2009 | Ozard |
| 7,593,204 B1 | 9/2009 | Iversen et al. |
| 7,876,156 B2 | 1/2011 | Tanaka et al. |
| 7,937,049 B2 | 3/2011 | Phillips et al. |
| 7,994,862 B1 | 8/2011 | Pukhovski |
| 8,334,722 B2 | 12/2012 | Sorrells et al. |
| 8,344,806 B1 | 1/2013 | Franck et al. |
| 8,477,832 B2 | 2/2013 | Sawatzky |
| 8,493,160 B2 | 7/2013 | Nicole et al. |
| 8,710,615 B2 | 4/2014 | Schmidt |
| 8,624,678 B2 | 7/2014 | Scott et al. |
| 8,774,737 B2 | 7/2014 | Mori et al. |
| 8,841,971 B1 | 9/2014 | Geis et al. |
| 8,847,688 B1 | 9/2014 | Mossawir |
| 8,890,211 B1 | 11/2014 | Mayo et al. |
| 9,070,506 B2 | 6/2015 | Anderson et al. |
| 9,184,284 B2 | 10/2015 | Zundel et al. |
| 9,178,493 B1 * | 11/2015 | Nobbe .................. H03F 3/195 |
| 9,197,194 B2 | 11/2015 | Reedy et al. |
| 9,479,122 B2 * | 10/2016 | Zhu ........................ H03F 3/20 |
| 9,722,551 B1 | 1/2017 | McKinley et al. |
| 9,608,102 B2 | 3/2017 | Johnson et al. |
| 9,768,766 B2 | 9/2017 | Willkofer et al. |
| 9,911,817 B2 | 3/2018 | Xia et al. |
| 9,978,858 B2 | 5/2018 | Johnson et al. |
| 10,132,696 B2 | 11/2018 | Kiep et al. |
| 2003/0095608 A1 | 5/2003 | Duperray |
| 2004/0150473 A1 * | 8/2004 | Hollingsworth .......... H03F 1/30 |
| | | 330/124 R |
| 2005/0035762 A1 | 2/2005 | Albrecht et al. |
| 2006/0256489 A1 | 11/2006 | Ker et al. |
| 2007/0085754 A1 | 4/2007 | Ella et al. |
| 2007/0264774 A1 | 11/2007 | Luo et al. |
| 2009/0072315 A1 | 3/2009 | Hodel et al. |
| 2009/0262034 A1 | 10/2009 | Satoh |
| 2010/0026387 A1 | 4/2010 | Blednov |
| 2012/0055230 A1 | 3/2012 | Naruse et al. |
| 2012/0153349 A1 | 6/2012 | Suzuki |
| 2013/0049763 A1 | 2/2013 | Jiang et al. |
| 2013/0099733 A1 | 4/2013 | Park et al. |
| 2014/0118074 A1 | 5/2014 | Levesque et al. |
| 2014/0197891 A1 | 7/2014 | Mooney et al. |
| 2014/0266432 A1 | 9/2014 | Scott et al. |
| 2014/0266460 A1 | 9/2014 | Nobbe et al. |
| 2014/0273888 A1 | 9/2014 | Levinger |
| 2015/0003490 A1 | 1/2015 | Ash et al. |
| 2015/0116039 A1 | 4/2015 | Ahmed et al. |
| 2016/0094187 A1 | 3/2016 | Staudinger et al. |
| 2016/0211813 A1 | 7/2016 | Gonzalez Jimenez |
| 2016/0285420 A1 | 9/2016 | Jones |
| 2017/0018617 A1 | 1/2017 | Xia et al. |
| 2017/0070247 A1 * | 3/2017 | Hageman .......... H04W 72/0406 |
| 2017/0093353 A1 | 3/2017 | Lautzenhiser |
| 2017/0104092 A1 | 4/2017 | Tanaka et al. |
| 2017/0126002 A1 | 5/2017 | Gittemeier |
| 2017/0294528 A1 | 10/2017 | Ren et al. |
| 2017/0131099 A1 | 11/2017 | Aoyama et al. |
| 2017/0345922 A1 | 11/2017 | Iucolano et al. |
| 2017/0359033 A1 | 12/2017 | Bazzani et al. |
| 2017/0359059 A1 | 12/2017 | Bazzani et al. |
| 2018/0062499 A1 | 3/2018 | Yamamoto et al. |
| 2018/0109228 A1 | 4/2018 | Kelly |
| 2018/0158917 A1 | 6/2018 | Odnoblyudov et al. |
| 2019/0028065 A1 | 1/2019 | Mahon et al. |
| 2019/0028066 A1 | 1/2019 | Mahon et al. |
| 2019/0078941 A1 | 3/2019 | Mahon et al. |

FOREIGN PATENT DOCUMENTS

| | | |
|---|---|---|
| DE | 10 2005 043270 A1 | 3/2007 |
| DE | 10 2007 039951 A1 | 2/2009 |
| EP | 2 565 608 A1 | 3/2013 |
| JP | H03-258008 A | 11/1991 |
| JP | H09-229778 A | 9/1997 |
| WO | WO 2007/035777 A2 | 3/2007 |
| WO | WO 2015/029159 A1 | 3/2015 |

OTHER PUBLICATIONS

Written Opinion of the International Preliminary Examining Authority for International Application No. PCT/US2016/046159, dated Oct. 10, 2017.
Ch. II International Preliminary Report on Patentability for International Application No. PCT/US2016/046159, dated Feb. 28, 2018.
International Search Report and Written Opinion for International Application No. PCT/US2017/056285, dated Jan. 3, 2018.
Written Opinion of the International Preliminary Examining Authority for International Application No. PCT/US2017/056285, dated Sep. 11, 2018.
Ch. II International Preliminary Report on Patentability for International Application No. PCT/US2017/056285, dated Dec. 12, 2018.
International Search Report and Written Opinion for International Application No. PCT/US2017/036717, dated Sep. 18, 2017.
Written Opinion of the International Preliminary Examining Authority for International Application No. PCT/US2017/036717, dated May 24, 2018.
Ch. II International Preliminary Report on Patentability for International Application No. PCT/US2017/036717, dated Sep. 3, 2018.
Invitation to Pay Additional Fees for International Application No. PCT/US2018/042757, dated Oct. 9, 2018.
International Search Report and Written Opinion for International Application No. PCT/US2018/042757, dated Dec. 10, 2018.
International Search Report and Written Opinion for International Application No. PCT/US2018/050859, dated Dec. 11, 2018.
Koyama et al., Implications of Using kW-level GaN Transistors in Radar and Avionic Systems. 2015 IEEE International Conference on Microwaves, Communications, Antennas and Electronic Systems. Nov. 2, 2015. 4 pages.

(56) References Cited

OTHER PUBLICATIONS

Kuzmik et al., Determination of channel temperature in AlGaN/GaN HEMTs grown on sapphire and silicon substrates using DC characterization method. IEEE Transactions on Electron Devices. Aug. 2002;49(8):1496-1498.
Schwitter et al., Impact of bias and device structure on gate junction temperature in AlGaN/GaN-on-Si HEMTs. IEEE Transactions on Electron Devices. May 2014;61(5):1327-34.
Schwitter et al., Parameter Extractions for a GaAs pHEMT thermal model using a TFR-heated test structure. IEEE Transactions on Electron Devices. Mar. 2015;62(3):795-801.
Schwitter et al., Study of gate junction temperature in GaAs pHEMTs using gate metal resistance thermometry. IEEE Transactions on Electron Devices. Oct. 2013;60(10):3358-64.
Schwitter et al., Transient gate resistance thermometry demonstrated on GaAs and GaN FET. 2016 IEEE MTT-S International Microwave Symposium (IMS). 2016;4 pages.
Sheng et al., Coupled microstrip line microwave phase shifter using ferroelectric thin film varactors. J of Applied Physics. Feb. 15, 2012;111(4):44506.
Sun et al., A new ESD protection structure for High-Speed GaAs RF ICs. IEEE Electron Device Letters. Mar. 2005; 26(3): 133-5.
U.S. Appl. No. 16/197,643, filed Nov. 21, 2018, Gittemeier.
U.S. Appl. No. 16/197,709, filed Nov. 21, 2018, Bazzani et al.
U.S. Appl. No. 15/293,515, filed Oct. 14, 2016, Kelly.
U.S. Appl. No. 15/181,841, filed Jun. 14, 2016, Bazzani et al.
U.S. Appl. No. 16/212,612, filed Dec. 6, 2018, Mahon et al.
U.S. Appl. No. 16/212,585, filed Dec. 6, 2018, Mahon et al.
U.S. Appl. No. 15/704,998, filed Sep. 14, 2017, Mahon et al.
U.S. Appl. No. 16/537,831, filed Aug. 12, 2019, Mahon et al.
U.S. Appl. No. 16/537,862, filed Aug. 12, 2019, Mahon et al.

\* cited by examiner

PHASE SHIFTERS FOR GALLIUM NITRIDE AMPLIFIERS AND RELATED METHODS

CROSS REFERENCE TO RELATED APPLICATIONS

This Application is a Continuation of U.S. application Ser. No. 15/293,515, filed Oct. 14, 2016, entitled "PHASE SHIFTERS FOR GALLIUM NITRIDE AMPLIFIERS AND RELATED METHODS". The entire contents of this applications are incorporated herein by reference in its entirety.

BACKGROUND

Technical Field

The technology relates to circuits to safeguard a device, such as a gallium nitride (GaN) device, from operating conditions that can damage or destroy the device.

Discussion of the Related Art

GaN semiconductor material has received appreciable attention in recent years because of its desirable electronic and electro-optical properties. GaN has a wide, direct bandgap of about 3.4 eV. Because of its wide bandgap, GaN is more resistant to avalanche breakdown and has a higher intrinsic field strength compared to more common semiconductor materials, such as silicon and gallium arsenide. In addition, GaN is able to maintain its electrical performance at higher temperatures as compared to other semiconductors, such as silicon or gallium arsenide. GaN also has a higher carrier saturation velocity compared to silicon. Additionally, GaN has a Wurtzite crystal structure, is a hard material, has a high thermal conductivity, and has a much higher melting point than other conventional semiconductors such as silicon, germanium, and gallium arsenide. Accordingly, GaN is useful for high-speed, high-voltage, and high-power applications. For example, GaN materials may be used as active circuit components in semiconductor amplifiers for radio-frequency (RF) communications, radar, and microwave applications.

SUMMARY

According to one aspect of the present application, an apparatus for providing a signal to a load is provided. The apparatus may comprise a gallium nitride (GaN) radio-frequency (RF) amplifier comprising an output terminal and configured to output an RF signal through the output terminal, a temperature sensor thermally coupled to the GaN RF amplifier and configured to sense a temperature of the GaN RF amplifier, a phase shifter electrically coupled to the output terminal of the GaN RF amplifier, and control circuitry coupled to the temperature sensor and the phase shifter and configured to receive, from the temperature sensor, data representing the temperature of the GaN RF amplifier, and cause, based at least in part on the data representing the temperature of the GaN RF amplifier, the phase shifter to shift the phase of the RF signal by a phase amount until the temperature of the GaN RF amplifier is within a safe temperature range.

In some embodiments, the control circuitry is configured to cause the phase shifter to shift the phase of the RF signal when it determines that the data representing the temperature of the GaN RF amplifier is greater than a threshold value.

In some embodiments, the phase amount is selected from a discrete set of selectable phase amounts.

In some embodiments, the discrete set of selectable phase amounts comprises approximately zero and approximately π.

In some embodiments, the phase amount is selected from a continuous set of selectable phase amounts.

In some embodiments, the phase shifter comprises a microstrip phase shifter.

In some embodiments, the phase shifter comprises a pin diode hybrid phase shifter.

In some embodiments, the GaN RF amplifier, the temperature sensor, the phase shifter and the control circuitry are disposed on a common substrate.

In some embodiments, the temperature sensor comprises one selected from the group consisting of a thermistor, a thermocouple, and a silicon bandgap temperature sensor.

In some embodiments, the phase amount is adjustable.

According to another aspect of the present application, a method for providing a signal to a load is provided. The method may comprise outputting a radio-frequency (RF) signal using a gallium nitride (GaN) RF amplifier, sensing a temperature of the GaN RF amplifier using a temperature sensor, and shifting a phase of the RF signal until the sensed temperature of the GaN RF amplifier is within a safe temperature range.

In some embodiments, shifting the phase of the RF signal until the sensed temperature of the GaN RF amplifier is within the safe temperature range comprises shifting the phase of the RF signal until the sensed temperature of the GaN RF amplifier is less than a threshold value.

In some embodiments, shifting the phase of the RF signal comprises shifting the phase of the RF signal by a predefined phase amount.

In some embodiments, the predefined phase amount is selected from among a discrete set of selectable phase amounts.

In some embodiments, the discrete set of selectable phase amounts comprises approximately zero and approximately π.

In some embodiments, the predefined phase amount is selected from among a continuous set of selectable phase amounts.

According to another aspect of the present application, a system for providing an RF signal to a load is provided. The system may comprise a gallium nitride (GaN) radio-frequency (RF) amplifier comprising an output terminal and configured to output the RF signal through the output terminal, a temperature sensor disposed in proximity to the GaN RF amplifier and configured to sense a temperature of the GaN RF amplifier, a phase shifter electrically coupled to the output terminal of the GaN RF amplifier, and control circuitry coupled to the temperature sensor and the phase shifter and configured to receive, from the temperature sensor, data representing the temperature of the GaN RF amplifier, and cause, based at least in part on the data representing the temperature of the GaN RF amplifier, the phase shifter to shift the phase of the RF signal such that the temperature of the GaN RF amplifier is limited.

In some embodiments, the control circuitry is configured to cause the phase shifter to shift the phase of the RF signal by a predefined phase amount.

In some embodiments, the predefined amount is adjustable.

In some embodiments, the predefined amount is selectable from among a discrete set of selectable phase amounts.

The foregoing apparatus and method embodiments may be included in any suitable combination with aspects, features, and acts described above or in further detail below. These and other aspects, embodiments, and features of the present teachings can be more fully understood from the following description in conjunction with the accompanying drawings.

BRIEF DESCRIPTION OF THE DRAWINGS

The skilled artisan will understand that the figures, described herein, are for illustration purposes only. It is to be understood that in some instances various aspects of the embodiments may be shown exaggerated or enlarged to facilitate an understanding of the embodiments. The drawings are not necessarily to scale, emphasis instead being placed upon illustrating the principles of the teachings. In the drawings, like reference characters generally refer to like features, functionally similar and/or structurally similar elements throughout the various figures. A depicted device or circuit may be integrated within a larger circuit.

When referring to the drawings in the following detailed description, spatial references "top," "bottom," "upper," "lower," "vertical," "horizontal," and the like may be used. Such references are used for teaching purposes, and are not intended as absolute references for embodied devices. The terms "on" and "over" are used for ease of explanation relative to the illustrations, and are not intended as absolute directional references. An embodied device may be oriented spatially in any suitable manner that may be different from the orientations shown in the drawings. The drawings are not intended to limit the scope of the present teachings in any way.

Figure 1:
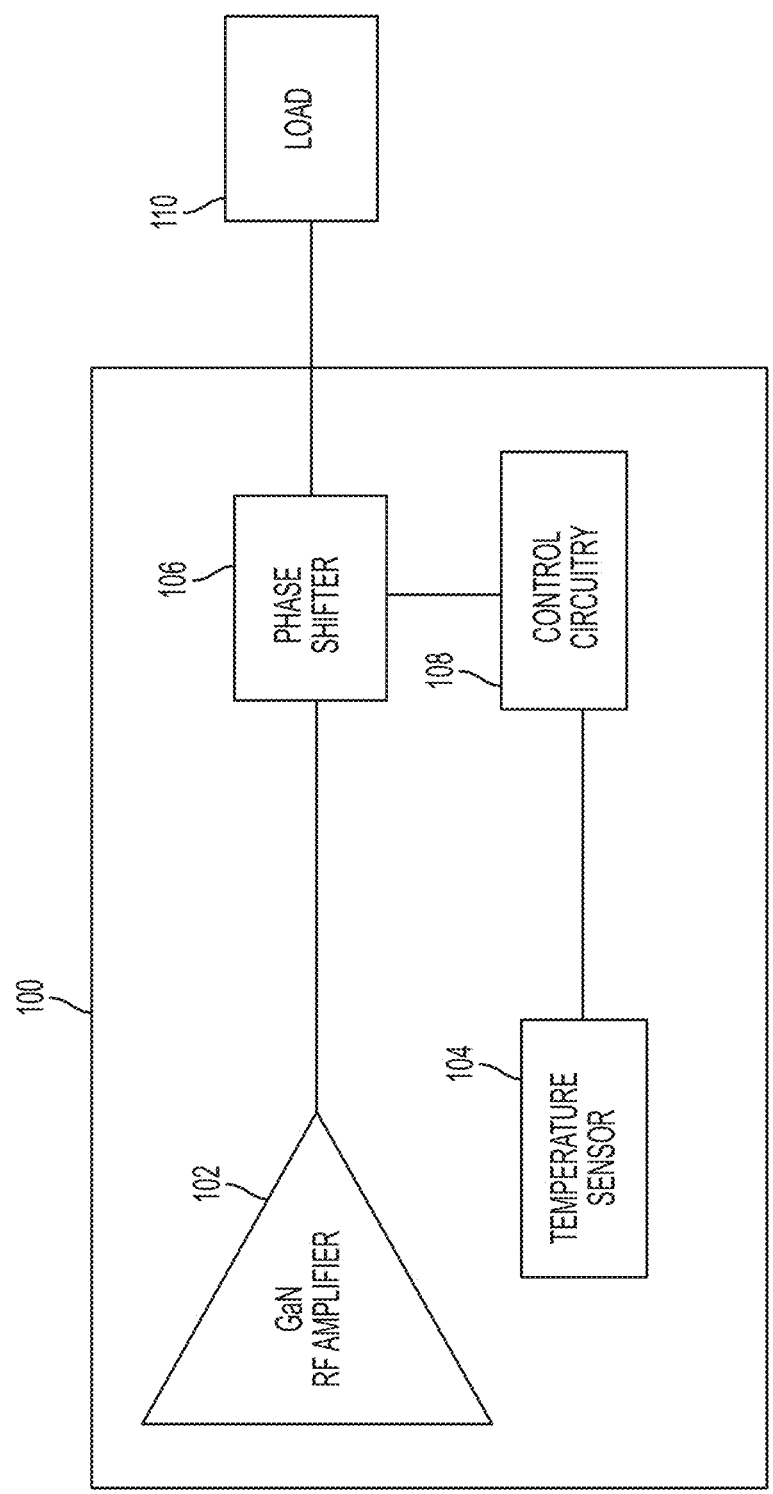
FIG. 1 is a block diagram illustrating a system for providing a radio-frequency (RF) signal to a load, according to some embodiments.

Features and advantages of the illustrated embodiments will become more apparent from the detailed description set forth below when taken in conjunction with the drawings.

DETAILED DESCRIPTION

As described above, transistors comprising gallium nitride (GaN) material are useful for high-speed, high-voltage, and high-power applications because of the favorable material properties of GaN. Some applications relating to RF communications, radar, and microwaves can place demanding performance requirements on devices that include GaN transistors. For example, some applications may require high-power transistors capable of amplifying signals to power levels between approximately 50 Watts and approximately 200 Watts.

The favorable properties of GaN transistors also come with new limitations relative to silicon based transistors. For example, the gate-to-source breakdown voltage of a GaN transistor may decrease as the temperature of the GaN transistor increases. The temperature of the GaN transistor may rise because of increases in the magnitude of the current in the GaN transistor caused by operating condition changes. The lower gate-to-source breakdown voltage may increase the gate-to-source leakage current in the GaN transistor and may lead to the complete failure of the GaN transistor.

The inventors have appreciated that the failure of GaN transistors from excess heat caused by overcurrent or overvoltage conditions may be prevented by introducing a phase shift between the GaN transistor and the load. In this way the effective impedance seen by the GaN transistor may be varied, and may be set to a value that reduces the heating of the GaN transistor. This approach may be particularly useful when the impedance of the load is not known a priori, and/or when the impedance of the load varies over time.

The inventors have conceived and developed various circuits and operating methods thereof to monitor the temperature of the GaN transistor (or other device) and adjust the impedance seen by the transistor when the temperature is outside a safe temperature range. The expression "safe temperature range" will be used herein to refer to temperatures that are not at risk of causing damage to a GaN transistor (e.g., caused by drain-to-source currents).

In some embodiments, control circuitry may be used to monitor the temperature of a GaN transistor, for example by receiving data obtained by a temperature sensor placed in proximity to the GaN transistor. If it is determined that the temperature is outside a safe temperature range, the control circuitry may cause a phase shifter to introduce, along the signal path, a phase shift between the GaN transistor and the load. The phase may be varied until the temperature of the RF transistor is deemed safe. In some embodiments, the phase may be varied by discrete amounts, such as by approximately 45°, approximately 90° or approximately 180°. In other embodiments, the phase may be varied continuously. It should be appreciated that the circuits and associated methods disclosed herein may be readily applied to protect devices other than GaN transistors.

FIG. 1 is a block diagram illustrating a system for providing a radio-frequency (RF) signal to a load, according to some non-limiting embodiments. System 100 may comprise GaN RF amplifier 102, temperature sensor 104, phase shifter 106 and control circuitry 108. System 100 may be connected to a load 110. GaN RF amplifier 102, also referred to herein as "the amplifier", may comprise one or more GaN transistors, such as one or more GaN metal-semiconductor field-effect transistors (MESFET) or high-electron-mobility transistors (HEMT). Alternatively, or additionally, amplifier 102 may comprise one or more transistors based on other III-nitride materials, such as aluminum nitride (AlN), indium nitride (InN), or any suitable alloy thereof. GaN RF amplifier 102 may receive an input RF signal through an input terminal (not shown in FIG. 1) and may output, at an input terminal, an amplified version of the RF input signal. The amplified signal may have any suitable frequency, or range of frequencies. For example, the amplified signal may have a carrier frequency that is between 10 MHz and 100 GHz, between 100 MHz and 10 GHz, between 910 MHz and 920 MHz, between 2.4 GHz and 2.5 GHz or within any other suitable range within such ranges. The amplified signal may have a power (e.g., the RMS power) between 10 mW and 1 KW in some embodiments, or within any range within such range.

Temperature sensor 104 may be disposed in proximity of GaN RF amplifier 102. For example, temperature sensor 104 may be placed to be thermally coupled to GaN RF amplifier 102. In this way, temperature sensor 104 may be sensitive to the temperature of a specific location within the GaN RF amplifier (e.g., the temperature of the surface of the die, the temperature of the substrate or the temperature of a junction of a GaN transistor). Temperature sensor 104 may be implemented using any suitable type of sensor, such as a thermocouple, a thermistor or a silicon bandgap temperature sensor. The temperature sensor 104 may output a signal that is representative of the sensed temperature. For example, the output signal may be proportional to the sensed temperature.

Phase shifter 106 may be coupled to the output terminal of GaN RF amplifier 102, and may receive the amplified signal. Phase shifter 106 may be configured to shift the phase of the amplified signal, thus varying the impedance seen by the amplifier. In this way, the power reflected by the load back to the amplifier may be limited. Phase shifter 106 may introduce any desired amount of phase shift, which may be varied discretely or continuously. Phase shifter 106 may be implemented using any suitable type of circuitry, such as a hybrid-coupler quadrature phase shifter, a Lange-coupler quadrature phase shifter or a rat-race quadrature phase shifter. In some embodiments, it may be desirable to limit the insertion loss associated with phase shifter 106. To limit such losses, a microstrip phase shifter may be used.

Control circuitry 108 may be coupled to temperature sensor 104, and may be configured to receive a signal representative of the temperature of the GaN RF amplifier. In addition, control circuitry 108 may be coupled to phase shifter 106, and may be configured to cause the phase shifter to shift the phase of the amplified signal by a desired amount when the sensed temperature is outside a safe temperature range. For example, the control circuitry may trigger a phase shift when the temperature of the GaN RF amplifier is greater than a predefined threshold temperature. The control circuitry may be configured to trigger phase shifts by any suitable amounts. In some embodiments, the range of phase shifts 0°-360° may be segmented in $2^n$ intervals, where n may be any integer equal to or greater than one. To each interval may correspond a selectable value for the phase shift. In one non-limiting example, the range may be segmented into two intervals, and the set of selectable values may comprise approximately 0° (e.g., between −10° and 10°) and approximately 180° (e.g., between 170° and 190°). Zero may be selected when the temperature of the amplifier is within a safe temperature range, otherwise 180° may be selected. In another non-limiting example, the set of selectable values may comprise approximately 0°, approximately 90°, approximately 180° and approximately 270°. The phase may be varied until the temperature sensed by the temperature sensor is safe. Control circuitry 108 may be implemented using any suitable type of circuitry, such as a microprocessor, a microcontroller, an application specific integrated circuit (ASIC) and/or a field-programmable gate array (FPGA). The control circuitry may further comprise a memory for storing data corresponding to a safe temperature range, e.g., a threshold temperature.

In some embodiments, at least two among GaN RF amplifiers 102, temperature sensor 104, phase shifter 106 and control circuitry 108 may be disposed on the same substrate, such a printed circuit board (PCB). In some embodiments, at least two among GaN RF amplifier 102, temperature sensor 104, phase shifter 106 and control circuitry 108 may be bonded using a suitable packaging technique, such as wire bonding or flip-chip bonding.

Load 110 may comprise a microwave oven, an antenna, a radar apparatus, a cellular phone transmitter, a plasma lighting system, a plasma emission system, or any other suitable type of load configured to receive microwave signals. In some embodiments, load 110 may exhibit an impedance that is not known a priori. As a result, the power reflected from the load when the load is driven with system 100 may be unknown. Additionally, or alternatively, the impedance of load 110 may vary over time. For example, as the load receives power from system 100, a physical property of the load, such as an electrical resistance and/or an electrical reactance, may vary. In such circumstances, the phase shift provided by phase shifter 106 may be adjusted to vary accordingly.

Figure 2:
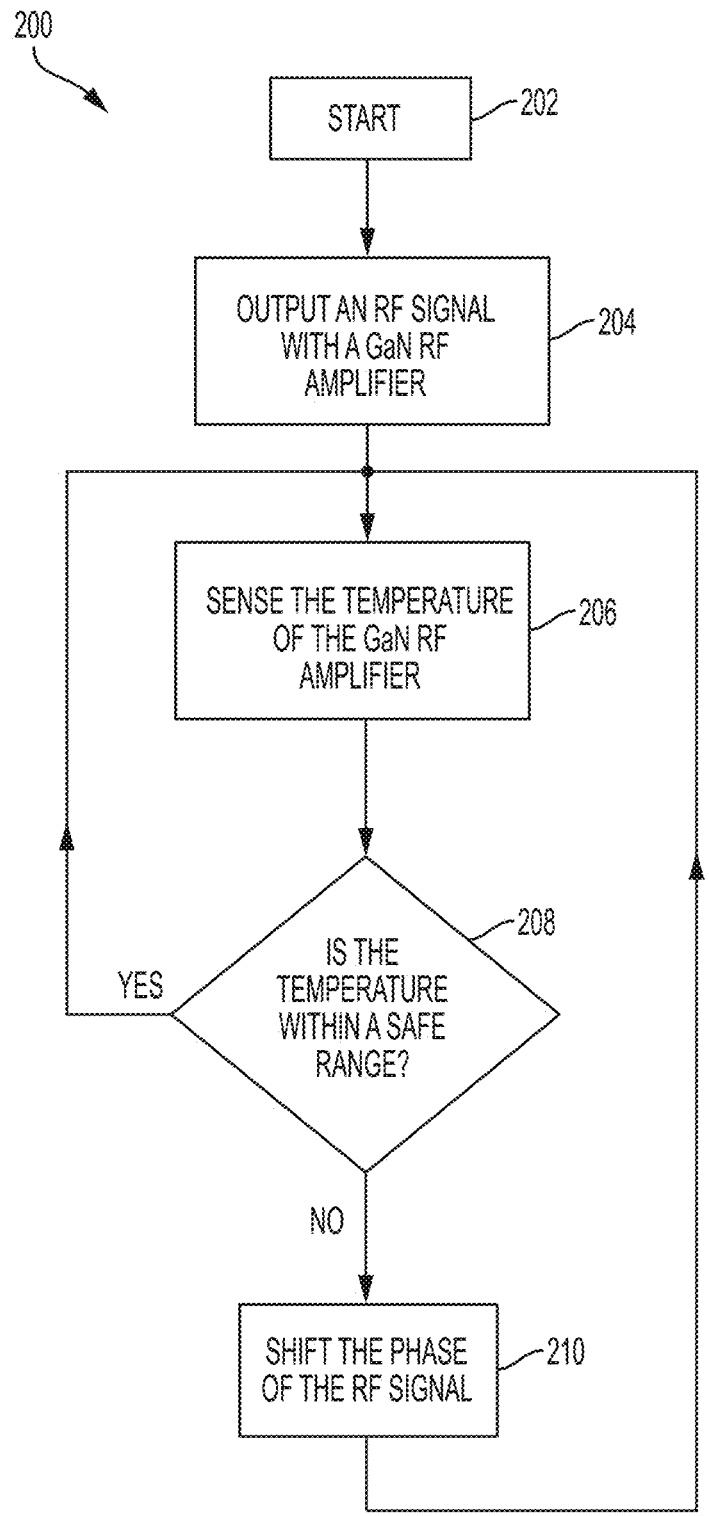
FIG. 2 is a flowchart illustrating a method for providing an RF signal to a load, according to some embodiments.

FIG. 2 is a flowchart illustrating a method of proving an RF signal to a load, according to some non-limiting embodiments. Method 200 may be implemented using system 100 in some embodiments. Method 200 may begin at act 202. At act 204, a GaN RF amplifier may output an RF signal, and may provide the RF signal to a load. Depending on the impedance seen by the GaN RF amplifier, a fraction of the output power may return back to the amplifier as a reflected signal. Such reflected signal may cause a rise in the temperature of the GaN RF amplifier, such as a rise in the temperature of a junction of a GaN transistor. At act 206, a temperature sensor thermally coupled to the GaN RF amplifier may sense a temperature of the GaN RF amplifier, and may produce a signal representative of such temperature. In some embodiments, the sensed temperature may be calibrated to be proportional to the temperature of a junction of a GaN transistor within the amplifier. At act 208, it is determined if the sensed temperature is within a safe temperature range, e.g., if the temperature is greater or lower than a threshold temperature. Such determination may performed using control circuitry coupled to the temperature sensor. If it is determined that the temperature is within such range, no action may be taken by the control circuitry, and the temperature sensor may continue to sense the temperature of the GaN RF amplifier. Otherwise, if it is determined that the temperature is outside such range, the phase of the signal output by the amplifier may be varied at act 210. The phase may be shifted discretely, or continuously, until the temperature of the GaN RF amplifier is within the safe range. Method 200 may continue for as long as the amplifier outputs a signal to the load.

Figure 3A:
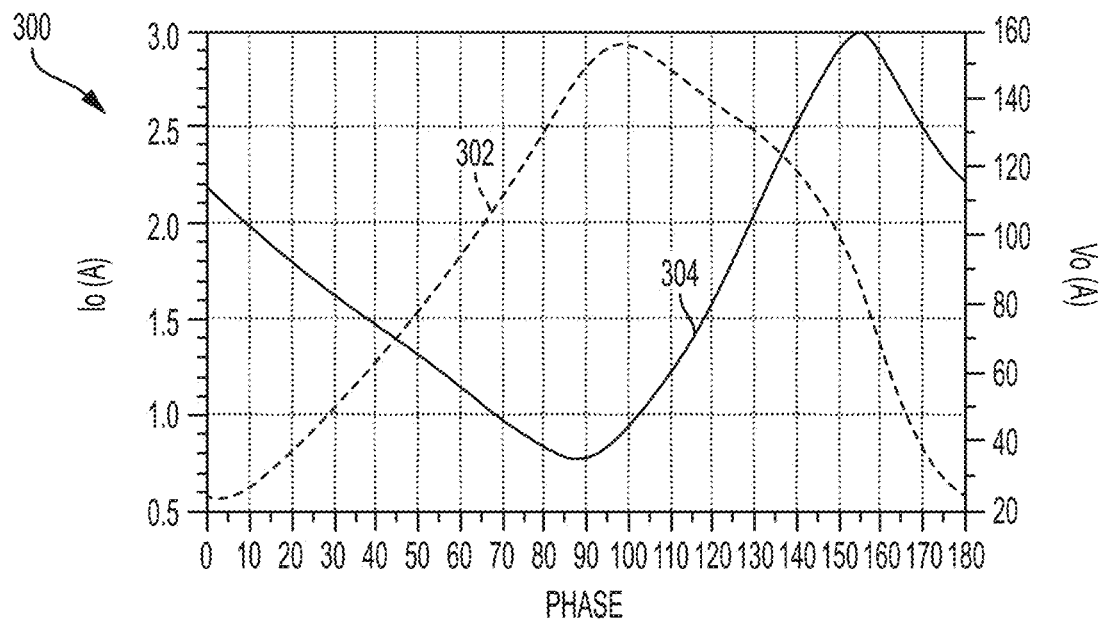
FIG. 3A is a plot illustrating a current and a voltage as a function of a phase, according to some embodiments.

As discussed above, the impedance of the load may be unknown. As a result, the power of the signal transferred to the load and the power of the reflected signal may be also unknown. FIG. 3A is a plot illustrating an example of a signal comprising a voltage and a corresponding current. In particular, plot 300 illustrates voltage $V_O$ obtained at an output terminal of amplifier 102 and a current $I_O$ output by amplifer 102 as a function of the phase of the reflected signal. In FIG. 3A, curve 302 represents $I_O$ while 304 represents $V_O$. In this example, $I_O$ exhibits a maximum at approximately 95° while $V_O$ exhibits a maximum at approximately 155°.

Figure 3B:
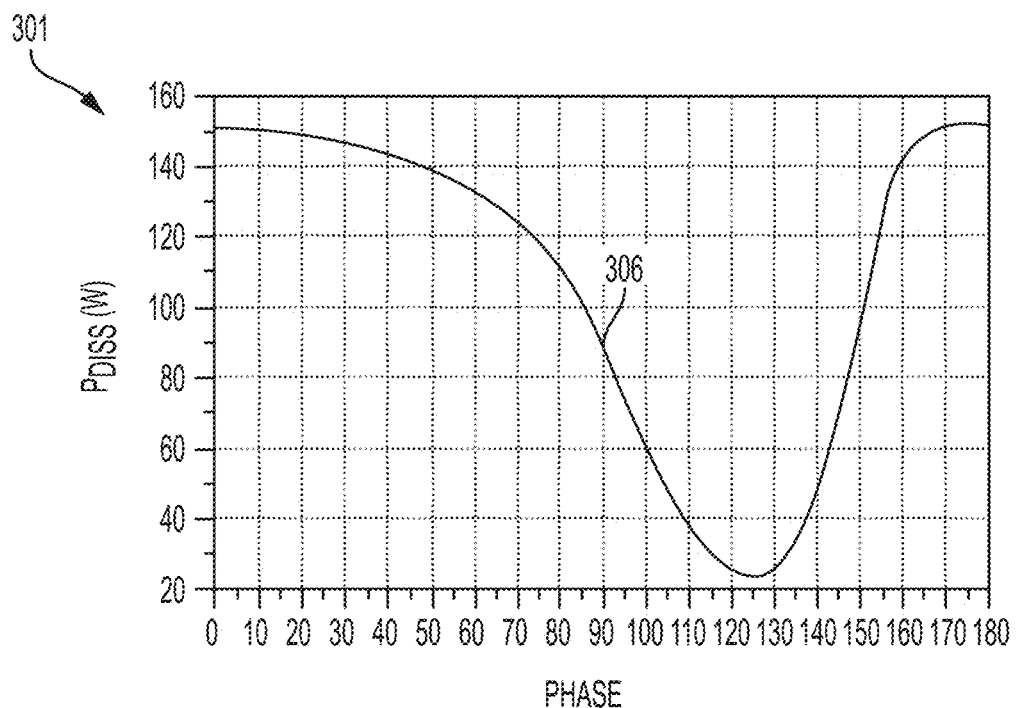
FIG. 3B is a plot illustrating power dissipated by an amplifier as a function of a phase, according to some embodiments.

The power dissipated at the GaN RF amplifier may be given by the combination of the power transferred to the load and the reflected power. An example of a dissipated power is illustrated in plot 301 of FIG. 3B. In this example, the power 306 exhibits a minimum at approximately 125°. Having a minimum in the dissipated power, the region of plot 301 surrounding 125° exhibits a corresponding minimum in the temperature of the amplifier. To prevent damage to the amplifier, it may desirable to operate GaN RF amplifier 102 in the region surrounding the minimum power dissipation (e.g., a region that is 90°-wide and centered about the phase of minimum power dissipation).

Figure 4:
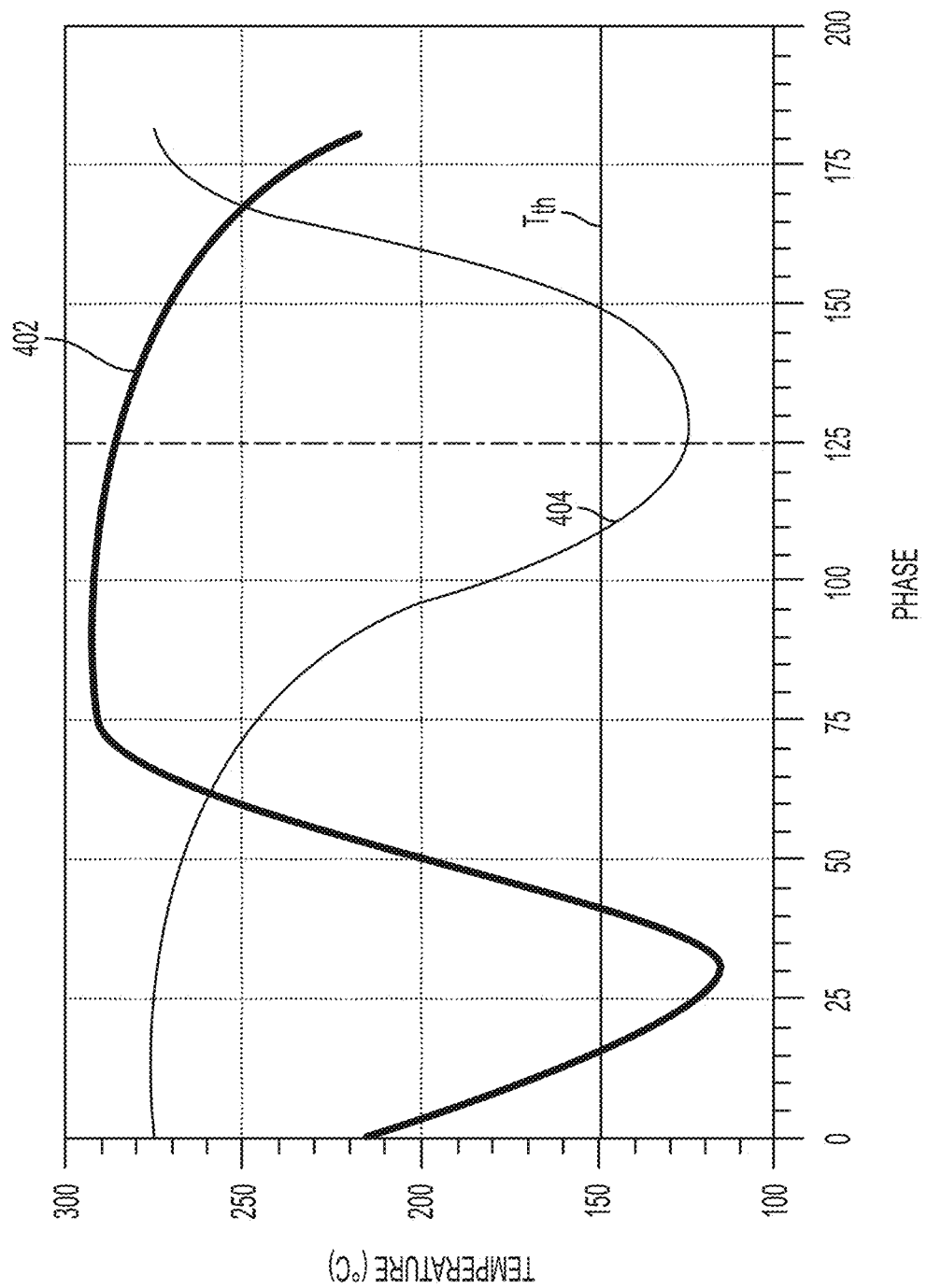
FIG. 4 is a plot illustrating a first RF signal and a second RF signal having an opposite phase with respect to the first RF signal, according to some embodiments.

However, in some circumstances, a GaN RF amplifier may operate in a region out of such desirable region of plot 301. FIG. 4 is a plot illustrating the temperature of GaN RF amplifier 102 as a function of the phase. In the example illustrated, the threshold temperature is set to 150° C., and as result the safe temperature range includes temperatures below 150° C. However, other threshold temperatures may be chosen. Curve 402 exhibits, at a phase of approximately 125°, a temperature that is well beyond the safe range. According to one aspect of the present application, control circuitry 108 may be configured to cause the phase shifter to introduce a phase shift when the temperature of the amplifier exceeds the threshold. As shown in the non-limiting example provided by curve 404, the phase of the amplified signal may be varied by approximately 90°, which may cause the temperature of the amplifier, at a phase of 125°, to drop below the threshold.

Figure 5:
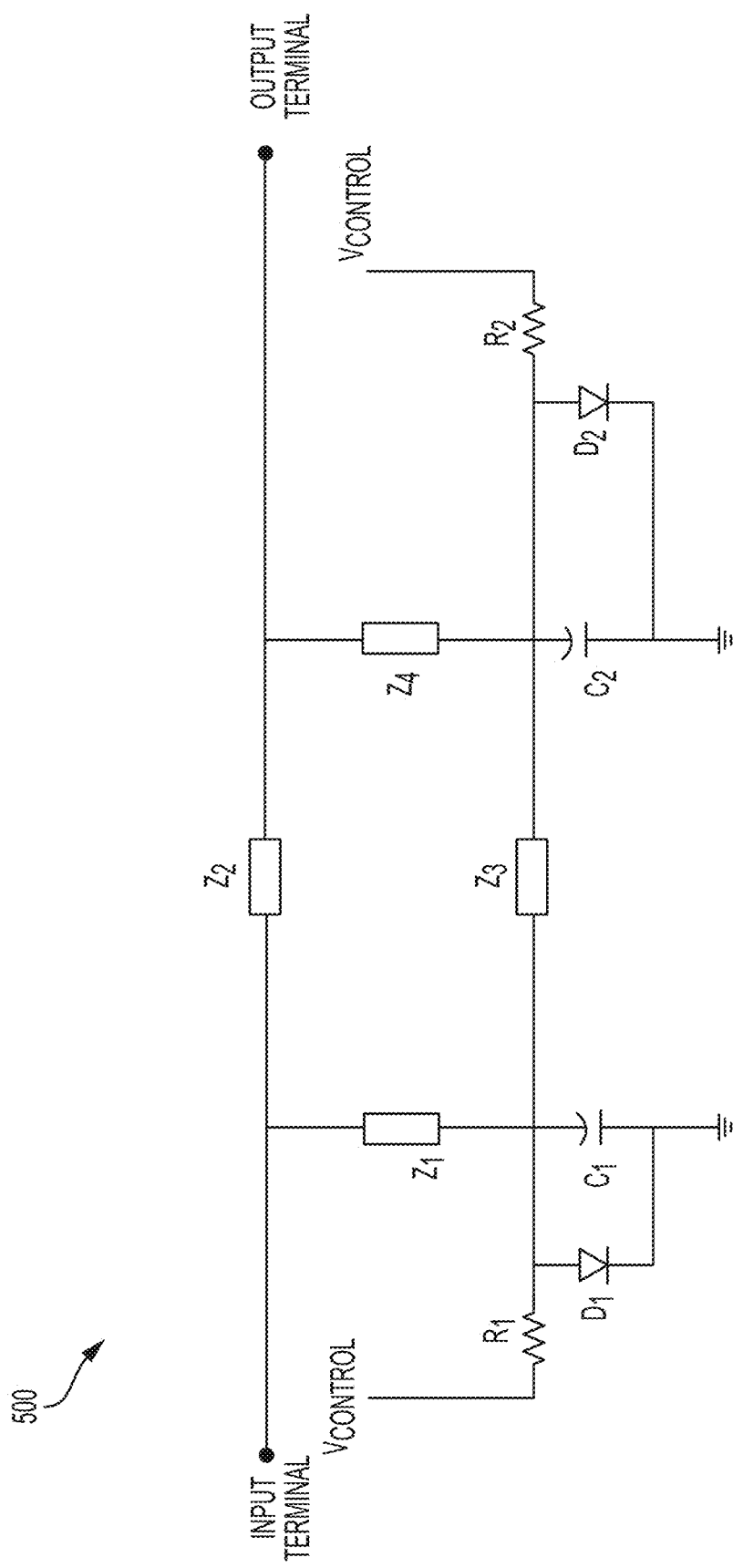
FIG. 5 is a circuit diagram illustrating an example of a phase shifter, according to some embodiments.

Phase shifter 106 may be implemented in any suitable way. In some embodiments, the phase shift introduced may be adjustable and may be selected from among a discrete set of selectable values. An example of a phase shifter is illustrated in FIG. 5. Phase shifter 500 may comprise a plurality of impedance elements disposed in a hybrid coupler configuration. The impedance elements may be implemented using transmission lines. In some embodiments, phase shifter 500 comprises four impedance elements $Z_1$, $Z_2$, $Z_3$ and $Z_4$. In some embodiments, the impedance of $Z_2$ and $Z_3$ may be approximately equal to each other, while the impedance of $Z_1$ and $Z_4$ may be approximately equal to the impedance of $Z_2$ divided by $\sqrt{2}$. Phase shifter 500 may further comprise resistors $R_1$ and $R_2$, pin diodes $D_1$ and $D_2$, and variable capacitors $C_1$ and $C_2$. Signal $V_{control}$, which may be provided by control circuitry 108, may be used to bias, through respective resistors $R_1$ and $R_2$, pin diodes $D_1$ and $D_2$. Variable capacitors $C_1$ and $C_2$ may have capacitances that depend on the bias of diodes $D_1$ and $D_2$. For example, $C_1$ and $C_2$ may represent the junction capacitances of $D_1$ and $D_2$. As an input signal is coupled to phase shifter 500 through the input terminal, the signal may split between a path going through $Z_2$, and a path going through $Z_1$. If diode $D_1$ is in a conductive state, the signal going through $Z_1$ may exhibit a reflection, whose value may depend on the capacitance of $C_1$. Similarly, if diode $D_2$ is in a conductive state, the signal going through $Z_4$ may exhibit a reflection, whose value may depend on the capacitance of $C_2$. As the reflected signals recombine at the output terminal, the resulting output signal may exhibit a phase difference with respect to the input signal. By adjusting the capacitances of $C_1$ and $C_2$ through $V_{control}$, the phase difference between the input signal and the output signal may be adjusted.

Figure 6:
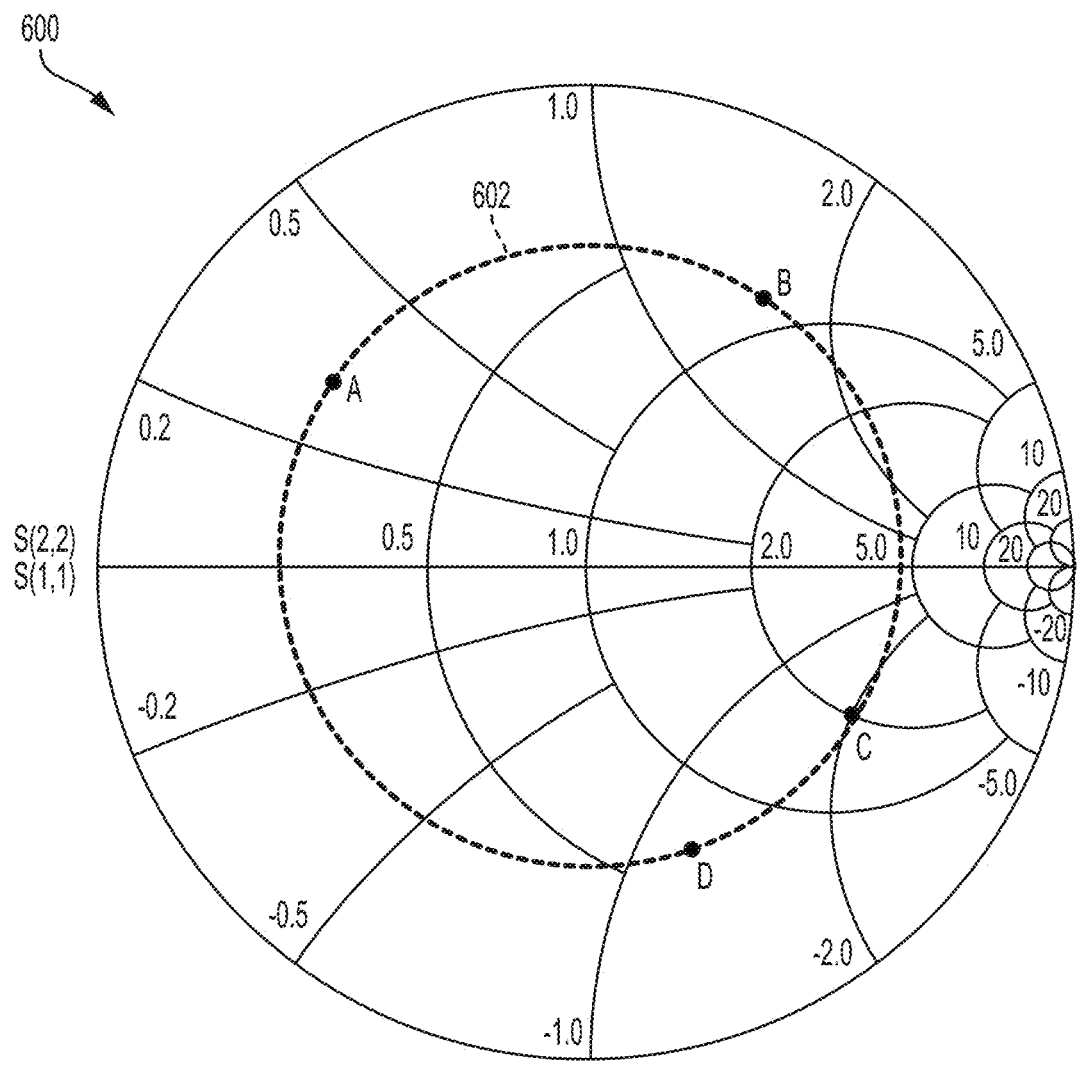
FIG. 6 is a Smith chart illustrating a plurality of points representing RF signals having different phases, according to some embodiments.

While the example shown in FIG. 4 illustrates how the temperature of the amplifier can be reduced below threshold by shifting the phase of the amplified signal by 180°, other phase shift amounts may be introduced in some circumstances. FIG. 6 is a Smith chart illustrating how the phase of the amplified signal may be varied. Before any phase shift is introduced, it will be assumed, in the non-limiting example of FIG. 6, that the impedance seen by the GaN RF amplifier is represented by point A on the Smith chart. In some embodiments, the impedance may be moved anywhere along the constant standing wave ratio circle 602 by introducing phase shifts between 0° and 180° (assuming no phase-dependent insertion losses). For example, if the impedance corresponding to point A causes the temperature of the amplifier to rise outside the safe range, the impedance may be moved, continuously or by discrete steps, to point B, C or D, until the temperature is reduced below threshold.

Figure 7:
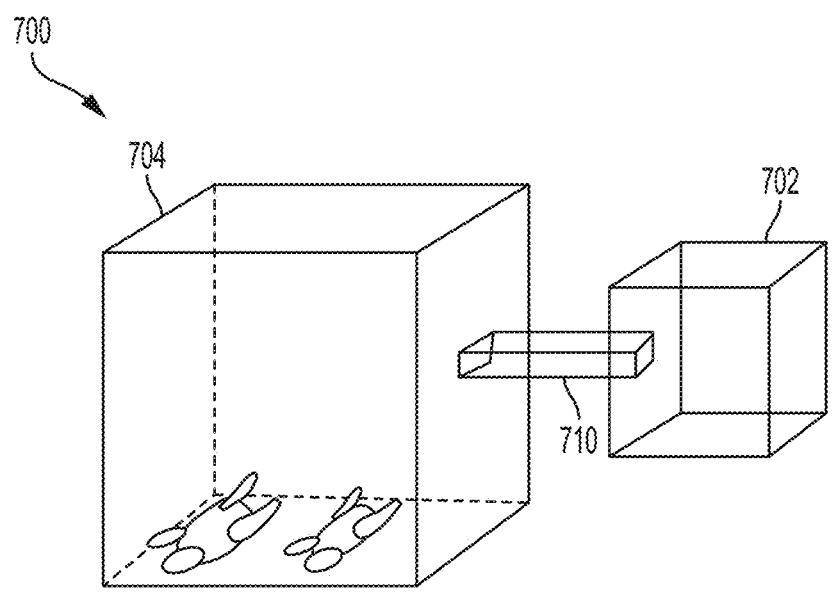
FIG. 7 illustrates schematically an RF amplifier for diving a microwave oven, according to some embodiments.

As described above, system 100 may be used in a variety of applications. One such application is in microwave ovens, whether domestic or industrial. Because the impedance of a microwave oven may depend on the type of food being cooked, on its quantity, and even on the temperature of the food, the amount of power reflected back to the amplifier may be unpredictable. In certain circumstances, for example, the reflected power may be comparable, or even exceed the power transferred to the load. Such reflections may lead to reductions in the lifetime of the amplifier. For this reason, routinely replacements of some parts of conventional amplifiers are often required, which may lead to substantial maintenance costs. According to one aspect of the present application, maintenance costs may be reduced by using systems and methods of the type described herein. FIG. 7 illustrates schematically a microwave oven cavity 704, connected to a microwave oven driver 702. Microwave oven driver 702 may comprise a system 100 in some embodiments. In the non-limiting example illustrated, a microwave oven driver 702 is connected to microwave oven cavity 704 via waveguide 710. However, the connection may be implemented using any suitable signal conductor. A microwave oven driver 704 may be disposed inside or outside microwave oven cavity 704. Microwave oven driver 702 may be configured to operate at approximately 915 MHz, at approximately 2.450 GHz, or at any other suitable frequency.

Aspects of the present application may provide one or more benefits, some of which have been previously described. Now described are some non-limiting examples of such benefits. It should be appreciated that not all aspects and embodiments necessarily provide all of the benefits now described. Further, it should be appreciated that aspects of the present application may provide additional benefits to those now described.

Being based on GaN, amplifiers of the type described herein may be able to output substantially more power compared to equivalent amplifiers using conventional transistors, such as silicon transistor. Nevertheless, in spite of the increased output power, aspects of the present application provide circuitry configured to prevent damage to the amplifiers caused by back reflections.

The terms "approximately" and "about" may be used to mean within ±20% of a target dimension in some embodiments, within ±10% of a target dimension in some embodiments, within ±5% of a target dimension in some embodiments, and yet within ±2% of a target dimension in some embodiments. The terms "approximately" and "about" may include the target dimension.

The technology described herein may be embodied as a method, of which at least some acts have been described. The acts performed as part of the method may be ordered in any suitable way. Accordingly, embodiments may be constructed in which acts are performed in an order different than described, which may include performing some acts simultaneously, even though described as sequential acts in illustrative embodiments. Additionally, a method may include more acts than those described, in some embodiments, and fewer acts than those described in other embodiments.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. An apparatus comprising:
   a gallium nitride (GaN) radio-frequency (RF) amplifier comprising an output terminal and configured to output an RF signal through the output terminal;
   a temperature sensor thermally coupled to the GaN RF amplifier and configured to sense a temperature of the GaN RF amplifier;
   a phase shifter electrically coupled to the output terminal of the GaN RF amplifier; and
   control circuitry coupled to the temperature sensor and the phase shifter and configured to:
      receive, from the temperature sensor, data representing the temperature of the GaN RF amplifier; and
      cause, based at least in part on the data representing the temperature of the GaN RF amplifier, the phase shifter to shift the phase of the RF signal by a phase amount until the temperature of the GaN RF amplifier is within a safe temperature range.

2. The apparatus of claim 1, wherein the control circuitry is configured to cause the phase shifter to shift the phase of the RF signal when it determines that the data representing the temperature of the GaN RF amplifier is greater than a threshold value.

3. The apparatus of claim 1, wherein the phase amount is selected from a discrete set of selectable phase amounts.

4. The apparatus of claim 3, wherein the discrete set of selectable phase amounts comprises approximately zero and approximately $\pi$.

5. The apparatus of claim 1, wherein the phase amount is selected from a continuous set of selectable phase amounts.

6. The apparatus of claim 1, wherein the phase shifter comprises a microstrip phase shifter.

7. The apparatus of claim 1, wherein the phase shifter comprises a pin diode hybrid phase shifter.

8. The apparatus of claim 1, wherein the GaN RF amplifier, the temperature sensor, the phase shifter and the control circuitry are disposed on a common substrate.

9. The apparatus of claim 1, wherein the temperature sensor comprises one selected from the group consisting of a thermistor, a thermocouple, and a silicon bandgap temperature sensor.

10. The apparatus of claim 1, wherein the phase amount is adjustable.

11. A method comprising:
    outputting a radio-frequency (RF) signal using a gallium nitride (GaN) RF amplifier;
    sensing a temperature of the GaN RF amplifier using a temperature sensor;
    determining whether the temperature of the GaN RF amplifier is within a safe temperature range; and
    shifting a phase of the RF signal until the sensed temperature of the GaN RF amplifier is within the safe temperature range responsive to determining that the temperature of the GaN RF amplifier is outside the safe temperature range.

12. The method of claim 11, wherein shifting the phase of the RF signal until the sensed temperature of the GaN RF amplifier is within the safe temperature range comprises shifting the phase of the RF signal until the sensed temperature of the GaN RF amplifier is less than a threshold value.

13. The method of claim 11, wherein shifting the phase of the RF signal comprises shifting the phase of the RF signal by a predefined phase amount.

14. The method of claim 13, wherein the predefined phase amount is selected from among a discrete set of selectable phase amounts.

15. The method of claim 14, wherein the discrete set of selectable phase amounts comprises approximately zero and approximately $\pi$.

16. The method of claim 13, wherein the predefined phase amount is selected from among a continuous set of selectable phase amounts.

17. A system for providing an RF signal to a load, the system comprising:
    a gallium nitride (GaN) radio-frequency (RF) amplifier comprising an output terminal and configured to output the RF signal through the output terminal;
    a temperature sensor disposed in proximity to the GaN RF amplifier and configured to sense a temperature of the GaN RF amplifier;
    a phase shifter electrically coupled to the output terminal of the GaN RF amplifier; and
    control circuitry coupled to the temperature sensor and the phase shifter and configured to:
       receive, from the temperature sensor, data representing the temperature of the GaN RF amplifier;
       determine whether the temperature of the GaN RF amplifier is above a threshold; and
       cause the phase shifter to shift the phase of the RF signal such that the temperature of the GaN RF amplifier is reduced responsive to the temperature of the GaN RF amplifier being above the threshold.

18. The system of claim 17, wherein the control circuitry is configured to cause the phase shifter to shift the phase of the RF signal by a predefined phase amount.

19. The system of claim 18, wherein the predefined phase amount is adjustable.

20. The system of claim 18, wherein the predefined phase amount is selectable from among a discrete set of selectable phase amounts.

* * * * *